(12) United States Patent
Sasada et al.

(10) Patent No.: US 7,411,179 B2
(45) Date of Patent: Aug. 12, 2008

(54) PHOTODETECTOR MODULE WITH IMPEDANCE MATCHING

(75) Inventors: Michihide Sasada, Yokosuka (JP); Osamu Kagaya, Tokyo (JP); Yukitoshi Okamura, Fujisawa (JP)

(73) Assignee: Opnext Japan, Inc., Yokohami-Shi (JP)

( * ) Notice: Subject to any disclaimer, the term of this patent is extended or adjusted under 35 U.S.C. 154(b) by 0 days.

(21) Appl. No.: 11/672,629

(22) Filed: Feb. 8, 2007

(65) Prior Publication Data
US 2008/0011938 A1    Jan. 17, 2008

(30) Foreign Application Priority Data
Apr. 25, 2006 (JP) ............... 2006-120562

(51) Int. Cl.
*H01L 27/14* (2006.01)
*H01L 23/12* (2006.01)
*H01L 23/52* (2006.01)

(52) U.S. Cl. ............... 250/239; 250/214 R; 250/214 A; 257/433; 257/678; 257/690; 257/698; 257/731

(58) Field of Classification Search ............... 250/208.1, 250/214 R, 214.1, 214 A, 239; 257/431–433, 257/678, 690, 692, 693, 700–702, 704, 723, 257/731; 385/14, 88–94, 129, 147; 174/50, 174/520, 535, 549

See application file for complete search history.

(56) References Cited

U.S. PATENT DOCUMENTS

| | | | |
|---|---|---|---|
| 6,841,815 B2 * | 1/2005 | Nguyen et al. ............... | 257/293 |
| 6,876,004 B2 * | 4/2005 | Rosenberg et al. ............ | 257/81 |
| 6,900,512 B2 * | 5/2005 | Kohmoto et al. ............. | 257/435 |
| 6,932,518 B2 * | 8/2005 | Greenlaw ..................... | 385/88 |
| 6,977,423 B2 * | 12/2005 | Kohmoto et al. ............. | 257/431 |
| 7,042,067 B2 * | 5/2006 | Giaretta et al. ............... | 257/664 |
| 7,044,657 B2 * | 5/2006 | Rosenberg et al. ............ | 385/92 |
| 7,073,959 B2 * | 7/2006 | Baek et al. .................... | 385/92 |
| 7,154,126 B2 * | 12/2006 | Aruga et al. .................. | 257/98 |
| 7,211,830 B2 * | 5/2007 | Rosenberg et al. ............ | 257/81 |
| 2004/0264980 A1 * | 12/2004 | Baek et al. .................. | 398/202 |
| 2005/0175312 A1 * | 8/2005 | Tanaka et al. ............... | 385/147 |
| 2006/0164817 A1 * | 7/2006 | Yoshida ........................ | 361/749 |

FOREIGN PATENT DOCUMENTS

JP    11-238916    8/1999

* cited by examiner

*Primary Examiner*—Davienne Monbleau
(74) *Attorney, Agent, or Firm*—Antonelli, Terry, Stout & Kraus, LLP.

(57) ABSTRACT

A photodetector module that can achieve impedance matching and power saving. A photodetector (11) and an amplifier (12) for amplifying an electric signal from the photodetector (11) are mounted on a stem (14). A dielectric plate (18) is arranged between the stem (14) and a flexible substrate (20). To transfer an electric signal from the amplifier (12) to the substrate (20), a lead pin (15*d*) is provided to pass through the stem (14) and the dielectric plate (18). The output of the amplifier (12) includes a capacitance component, and the output impedance of the amplifier (12) is higher than the impedance that matches with the substrate (20). Further, the thickness d of the dielectric plate (18) is such that the inductance component of the lead pin (15*d*) includes an inductance component that is inductive, which cancels the capacitance component of the amplifier, and impedance matching with the substrate (20) can be achieved.

2 Claims, 5 Drawing Sheets

US 7,411,179 B2

PHOTODETECTOR MODULE WITH IMPEDANCE MATCHING

This application relates to and claims priority from Japanese Patent Application No. 2006-120562, filed on Apr. 25, 2006, the entire disclosure of which is incorporated herein by reference.

FIELD OF THE INVENTION

The present invention relates to a photodetector module that is equipped with a photodetector and is connected to a substrate to which an electronic signal generated by photoelectrical conversion in the photodetector is transferred.

BACKGROUND OF THE INVENTION

For photodetector modules, technology has been developed for achieving impedance matching with a substrate to which the photodetector module is connected. An example of such technology is described in Japanese Unexamined Patent Application, Laid-Open No. H11-238916 (hereinafter referred to as Patent Document 1).

In order to prevent degradation of a high-frequency response characteristic due to an inductance component of a lead pin (leading pin) for connecting such a module to a substrate, the Patent Document 1 proposes to remove the inductance component by placing a metal sleeve on the periphery of the lead pin to form a coaxial line consisting of the lead pin and the metal sleeve.

SUMMARY OF THE INVENTION

Although many conventional techniques including the above-mentioned Patent Document 1 consider impedance matching, those techniques do not basically consider power saving for a photodetector module. However, users of photodetector modules require that the photodetector modules have matched impedance and in addition consume a low amount of power.

An object of the present invention is to provide a photodetector module that has matched impedance and has low power consumption, in order to respond to the above requirements.

To solve the problem, the photodetector module of the present invention is provided with a photodetector and is connected to a substrate that is a target of transmission of an electric signal which is photoelectrically converted in the photodetector, the photodetector module comprising: an amplifier for amplifying the electric signal received from the photodetector; a board on which the photodetector and the amplifier are mounted; a dielectric placed between the board and the substrate; and a lead pin extending through the board and the dielectric to the substrate, so as to transfer the electric signal amplified by the amplifier to the substrate; wherein output of the amplifier includes a capacitance component, and an output impedance of the amplifier is higher than an impedance that matches with the substrate; and thickness of the dielectric in a direction from the board to the substrate is such that an inductance component of the lead pin includes an inductance component canceling the capacitance component of the amplifier, and impedance matching with the substrate can be achieved.

The present invention employs an amplifier of high impedance, whose output includes a capacitance component, in order to achieve power saving in the amplifier. Owing to the high output impedance of the amplifier, impedance matching with the substrate is lost. To solve this problem, the present invention provides a dielectric to cancel the capacitance component of the output of the amplifier and to achieve impedance matching.

DETAILED DESCRIPTION OF THE PREFERRED EMBODIMENTS

Figure 1:
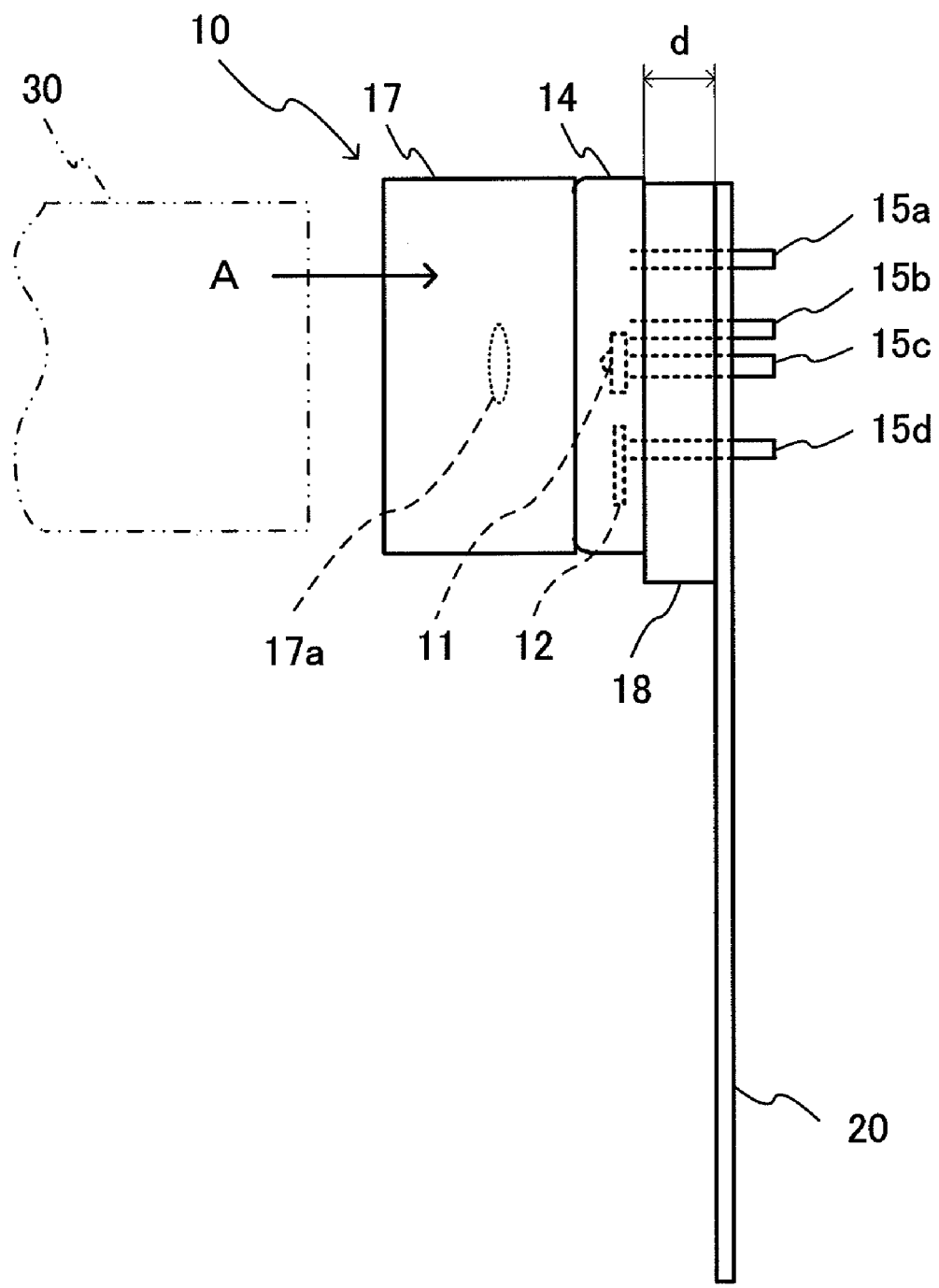
FIG. 1 is a side view showing a photodetector module according to one embodiment of the present invention.

Below, one embodiment of a photodetector module according to the present invention will be described referring to the drawings.

Figure 2:
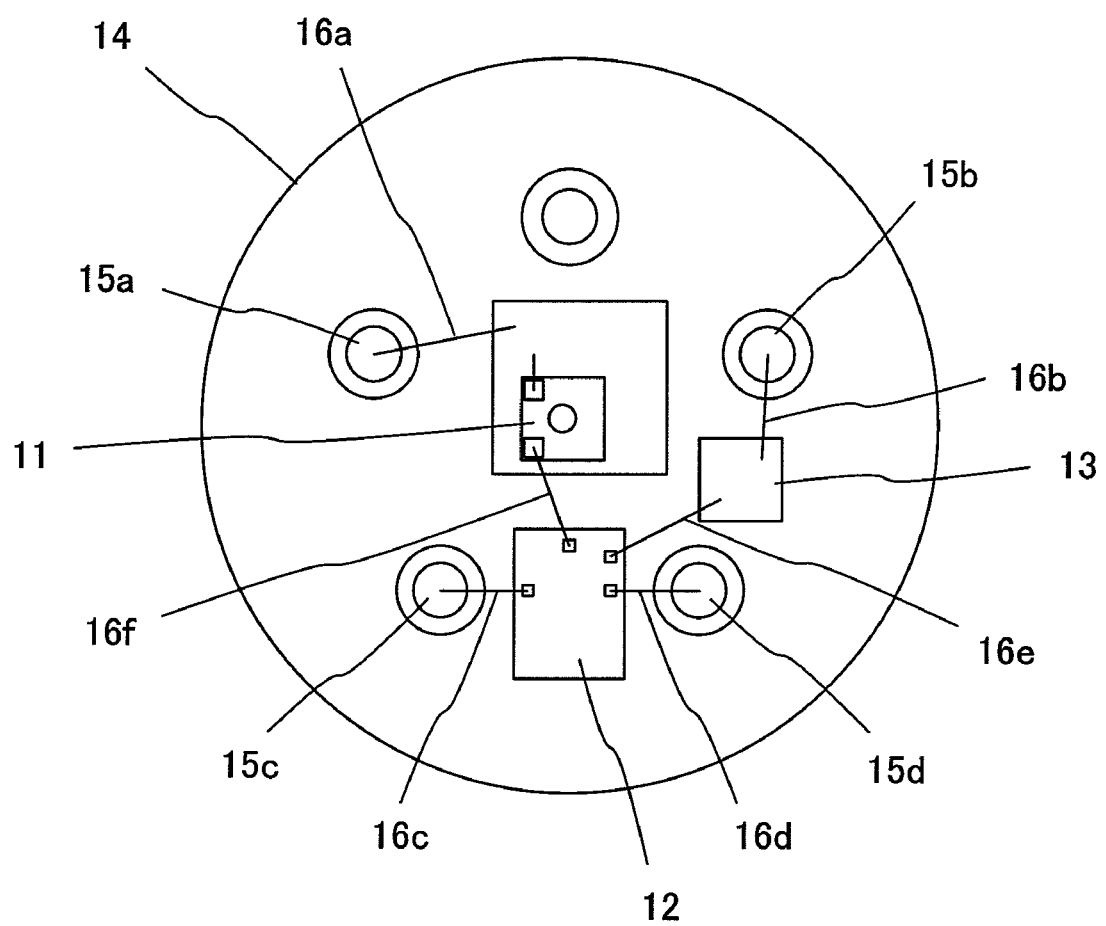
FIG. 2 is a view seen from the direction of an arrow A in FIG. 1.

As shown in FIGS. 1 and 2, the photodetector module of the present embodiment is connected to a flexible substrate 20. This photodetector module 10 comprises: a photodetector 11 that converts an optical signal from an optical fiber 30 into an electric signal; a transimpedance amplifier (hereinafter, referred to as TIA) 12 that amplifies the electric signal received from the photodetector 11; a filter 13; a metallic stem 14 on which the mentioned components are mounted; a metallic cap 17 on which an optical system 17*a* for condensing light from the optical fiber 30 is mounted; a dielectric plate 18 that is placed between the stem 14 and the flexible substrate 20; and a plurality of lead pins 15*a*, 15*b*, 15*c* and 15*d* that extend to the substrate 20 through the stem 14 and the dielectric plate 18 in order to electrically connect the respective elements mounted on the stem 14 to the substrate 20.

The TIA 12 performs impedance transformation of the electric current signal received from the photodetector 11, amplifies the electric signal, and outputs the amplified signal as a voltage signal.

The plurality of lead pins 15*a*, 15*b*, 15*c* and 15*d* includes a power supply pin 15*a* for supplying power from the substrate 20 to the photodetector 11, a power supply pin 15*b* for supplying power from the substrate 20 to the TIA 12, and signal transfer pins 15*c* and 15*d* for transferring electric signals from TIA 12 to the substrate 20. The power supply pin 15*a* for the photodetector 11 is connected to the photodetector 11 through a power supply wire 16*a*. The power supply pin 15*b* for the TIA 12 is connected to the filter 13 through a power supply wire 16*b*, and the filter 13 to TIA 12 through power supply wires 16*e*. Further, the photodetector 11 and TIA 12 are connected with each other through a signal transfer wire 16*f*. TIA 12 is connected to the signal transfer pins 15*c* and 15*d* through signal transfer wires 16*c* and 16*d*, respectively.

In the present embodiment, the substrate 20 has a characteristic impedance of 50Ω. Accordingly, when the output impedance of TIA 12 is 50Ω, the impedance of the photodetector module 10 is matched with the substrate 20.

Figure 4:
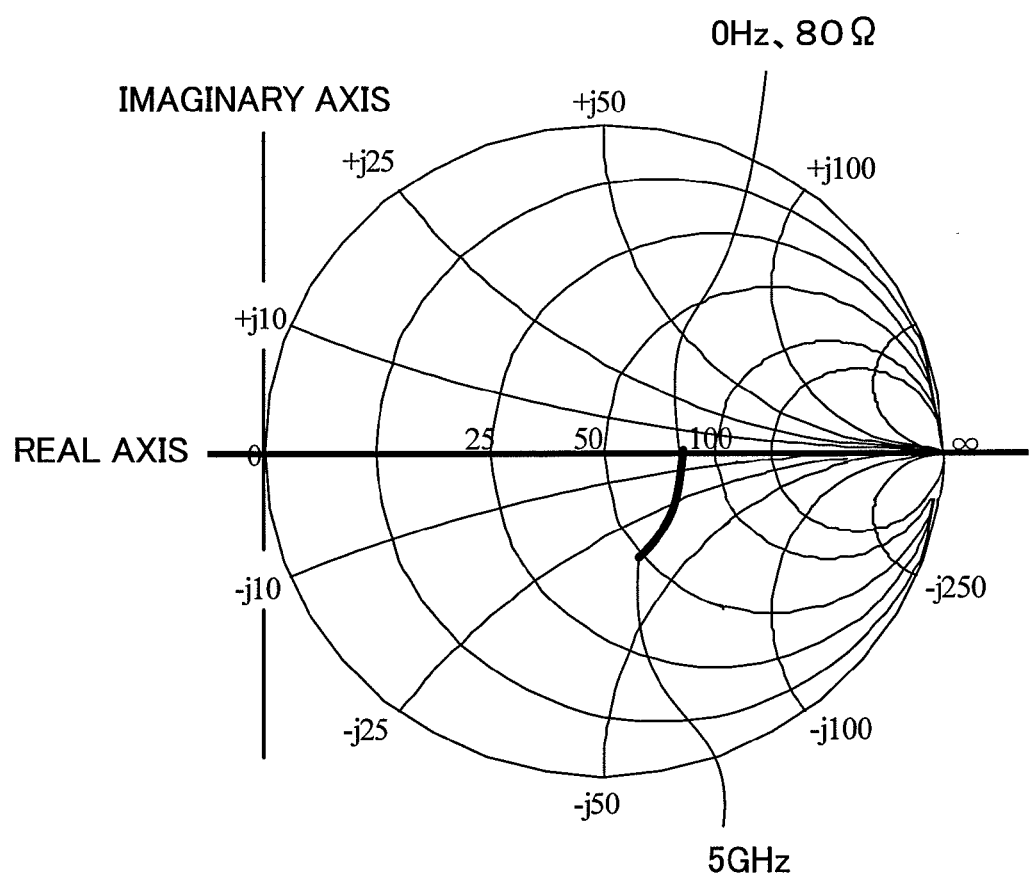
FIG. 4 is a Smith chart in cases where a dielectric plate is not provided in an embodiment of the present invention.

Here, the output impedance characteristic of the TIA 12 of the present embodiment will be described referring to FIG. 4. FIG. 4 is a Smith chart that shows the complex reflection coefficient, in other words, the scattering coefficient sofa signal viewed from the signal transfer pin 15*d* toward the input port (i.e. the photosensitive part) of the photodetector 11, changing the frequency from 0 Hz through 5 GHz, assuming that the dielectric plate 18 is not provided. In the figure, the horizontal axis is a real axis and the vertical axis is an imaginary axis. As seen from the figure, the output impedance of TIA 12 is 80Ω at 0 Hz, and, as the frequency becomes higher, the scattering coefficient s swings to the −j side and the capacitance component increases.

In other words, in the present embodiment it is intentionally arranged that the output of the TIA 12 includes the capacitance component, and that the output impedance of the TIA 12 is 80Ω, which is higher than an impedance (50Ω) that matches with the substrate 20.

Thus, according to the present embodiment, the output impedance of the TIA 12 is raised, and accordingly power consumption of the TIA 12 can be reduced.

In the present embodiment, since the output impedance of the TIA 12 is raised as described above, impedance matching with the substrate 20 is not achieved. Accordingly, in the present embodiment, the dielectric plate 18 is arranged between the stem 14 and the flexible substrate 20, so that the inductance component that has inductivity, i.e. the +j component, is generated to cancel the capacitance component of the output of the TIA 12, in order to achieve impedance matching with the substrate 20. In the present embodiment, the thickness of the dielectric plate 18, namely, the distance d between the stem 14 and the substrate 20, is adjusted to obtain an inductance component that can cancel the capacitance component of the output of the TIA 12. In this embodiment, Flame Retardant type 4 (FR4) is used for the dielectric plate 18. This FR4 is a flame retardant print board material, which is a composite material of glass and epoxy resin and has a dielectric constant ∈ of 4.8. Clearly, the present invention is not limited to this material.

The distance d between the stem 14 and the substrate 20 is determined by electromagnetic field analysis simulation.

In this simulation expressing photoelectric conversion of the photodetector 11 by an equivalent circuit, the input part (i.e. the photosensitive part) of the photodetector 11 is taken as an input port 1 and the output terminal of the flexible substrate 20 as an output port 2. The frequency characteristic of the forward transfer constant (S21) is obtained when the output impedance of the TIA 12 and the distance d between the stem 14 and the substrate 20 are changed. Specifically, the difference ΔS21 (=S21 (5 GHz)−S21 (1 GHz)) between S21 at 5.5 GHz and S21 at 1 GHz is obtained, changing the output impedance of the TIA 12 and the distance d between the stem 14 and the substrate 20.

Figure 3:
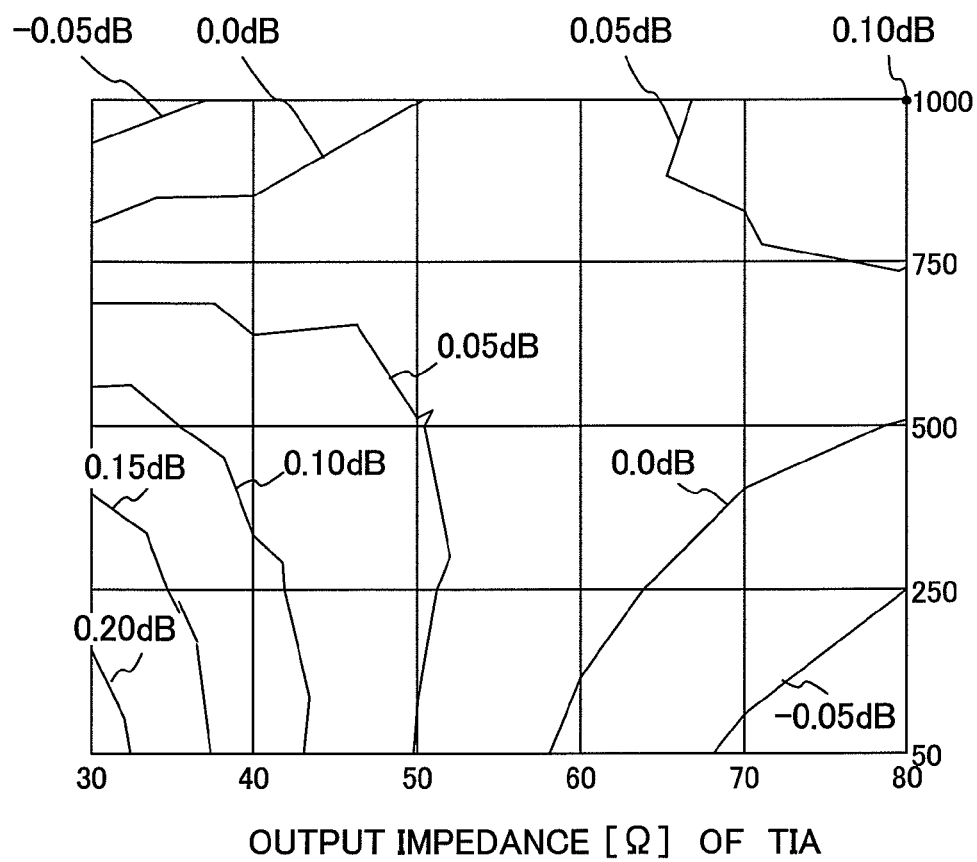
FIG. 3 is an explanatory diagram showing output impedance of a transimpedance amplifier (TIA) and frequency characteristics in cases where distance between system and a substrate is changed in an embodiment of the present invention.

The result of this simulation is shown in FIG. 3.

As described above, when the output impedance of the TIA 12 is 80Ω and the distance between the stem 14 and the substrate 20 is 0.58 mm or less, ΔS21 becomes negative. Basically, ΔS21 should be 0 dB. In practice, however, a small plus value is favorable, considering loss on the downstream side. Here, the distance of 1.0 mm, for which ΔS21 becomes +0.1 dB, is employed to substantially achieve impedance matching.

Figure 5:
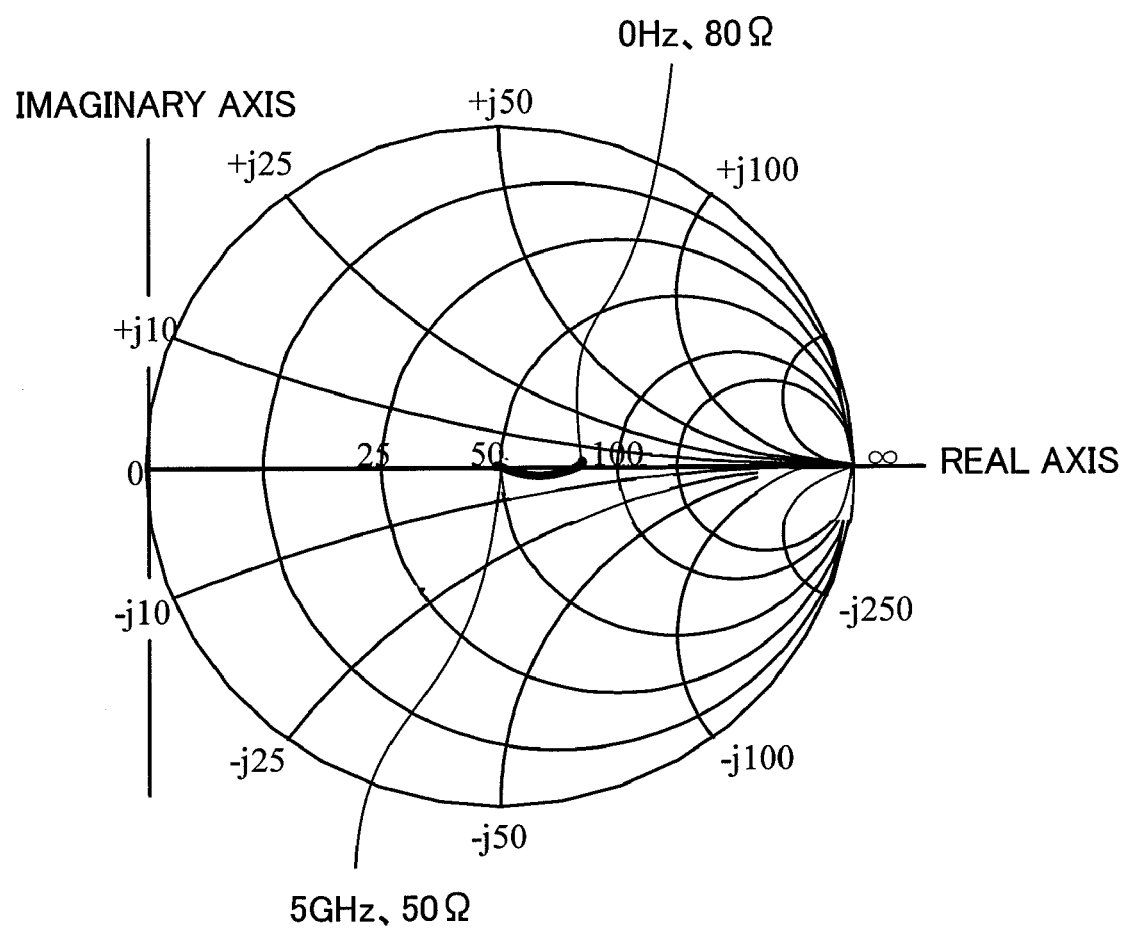
FIG. 5 is a Smith chart in cases where a dielectric plate is provided in an embodiment of the present invention.

FIG. 5 is a Smith chart showing the complex reflection coefficient of a signal seen from the output terminal of the flexible substrate 20 toward the input port (i.e. the photosensitive part) of the photodetector 11, when the frequency is changed from 0 Hz through 5 GHz, in the state in which the dielectric plate 18 is provided. As seen from the figure, when the frequency is 5 GHz, the impedance value is 50Ω at the center of the circle, and thus impedance matching is achieved.

As described above, the present embodiment employs the TIA 12 of high output impedance such that its output includes the capacitance component. As a result, power saving in the TIA 12 is attained while achieving impedance matching with the substrate 20 by providing the dielectric plate 18 to cancel the capacitance component of the output of the TIA 12.

The invention claimed is:

1. A photodetector module that is equipped with a photodetector and is connected to a substrate that is a target of transmission of an electric signal which is photoelectrically converted in the photodetector, the photodetector module comprising:

an amplifier which amplifies the electric signal from the photodetector;
a board on which the photodetector and the amplifier are mounted;
a dielectric placed between the board and the substrate; and
a lead pin extending through the board and the dielectric to the substrate, so as to transfer the electric signal amplified by the amplifier to the substrate; wherein
output of the amplifier includes a capacitance component, and an output impedance of the amplifier is higher than an impedance that matches with the substrate; and
thickness of the dielectric in a direction from the board to the substrate is such that an inductance component of the lead pin includes an inductance component canceling the capacitance component of the amplifier, and impedance matching with the substrate can be achieved.

2. A photodetector module according to claim 1, wherein: the photodetector module is a CAN module comprising a metallic stem of a disk shape as the board.

* * * * *